United States Patent
Teng et al.

(10) Patent No.: US 8,148,996 B2
(45) Date of Patent: Apr. 3, 2012

(54) CIRCUIT TESTING APPARATUS

(75) Inventors: Cheng-Yung Teng, Taipei County (TW); Hung-Wei Chen, Taipei County (TW); Yung-Yu Wu, Yilan County (TW)

(73) Assignee: Princeton Technology Corporation, Hsien Tien, Taipei County (TW)

( * ) Notice: Subject to any disclaimer, the term of this patent is extended or adjusted under 35 U.S.C. 154(b) by 704 days.

(21) Appl. No.: 11/798,000

(22) Filed: May 9, 2007

(65) Prior Publication Data

US 2008/0191730 A1   Aug. 14, 2008

(30) Foreign Application Priority Data

Feb. 14, 2007   (TW) ................................. 96202844 U

(51) Int. Cl.
*G01R 31/02* (2006.01)
*G01R 31/28* (2006.01)

(52) U.S. Cl. ..................... 324/537; 324/762.03; 714/738

(58) Field of Classification Search .................. 324/537, 324/73.1, 750.3, 762.01–762.1; 714/724–745
See application file for complete search history.

(56) References Cited

U.S. PATENT DOCUMENTS

| | | | | |
|---|---|---|---|---|
| 3,302,109 A | * | 1/1967 | Jones | 714/736 |
| 4,503,536 A | * | 3/1985 | Panzer | 714/732 |
| 4,608,647 A | * | 8/1986 | White et al. | 702/108 |
| 5,161,185 A | * | 11/1992 | Hochschild | 379/416 |
| 5,512,842 A | * | 4/1996 | Kida | 324/765 |
| 5,598,100 A | * | 1/1997 | Maeda et al. | 324/501 |
| 5,701,309 A | * | 12/1997 | Gearhardt et al. | 714/736 |
| 5,712,855 A | * | 1/1998 | Goto et al. | 714/700 |
| 5,909,186 A | * | 6/1999 | Gohringer | 341/120 |
| 6,028,439 A | * | 2/2000 | Arkin et al. | 324/765 |
| 6,683,470 B2 | * | 1/2004 | Takeuchi | 324/762.01 |
| 6,693,436 B1 | * | 2/2004 | Nelson | 324/537 |
| 6,870,778 B2 | * | 3/2005 | Ozawa et al. | 365/189.09 |
| 7,131,046 B2 | * | 10/2006 | Volkerink et al. | 714/732 |
| 7,173,443 B1 | * | 2/2007 | Asami | 324/762.01 |
| 7,327,153 B2 | * | 2/2008 | Weinraub | 324/756.01 |

* cited by examiner

*Primary Examiner* — Timothy J Dole
(74) *Attorney, Agent, or Firm* — Muncy, Geissler, Olds & Lowe, PLLC

(57) ABSTRACT

The invention discloses a circuit testing apparatus for testing a device under testing. The circuit testing apparatus includes a logic tester and a signal-measuring module. The logic tester is coupled to the device under testing for providing a testing signal and a trigger signal, and then determining a testing result for the device under testing according to a digital measuring result. The signal-measuring module coupled to the device under testing and the logic tester, is utilized for measuring a DC signal generated by the device under testing according to the testing signal after receiving the trigger signal, and generating the digital measuring result.

11 Claims, 3 Drawing Sheets

CIRCUIT TESTING APPARATUS

BACKGROUND OF THE INVENTION

1. Field of the Invention

The invention relates to a circuit testing apparatus, and more particularly, to a circuit testing apparatus utilizing a logic tester for testing the DC voltage of the integrated circuits.

2. Description of the Related Art

Usually, the integrated circuit (IC) test after fabrication is necessary to assure the quality of the integrated circuit. The manufacturers thus determine whether the integrated circuit is qualified according to the test result and provide for the merchants.

FIG. 1 is a schematic diagram of a conventional apparatus for testing the integrated circuit. A logic tester 10 is provided for testing a device under testing (DUT) 22. The device under testing 22, which is preferably provided on a circuit board with the device under testing (DUT board) 20, may be an integrated circuit (IC) under test.

The input state and the logic level of the device under testing 22 are commonly provided prior to the use of the logic tester 10 for measuring the DC voltage of the device under testing 22. A function generator 12 of the logic tester 10 sequentially inputs a single testing code to the input pin of the device under testing 22. The device under testing 22 receives the single testing code from the input pin and generates a corresponding DC voltage in the output pin. The logic tester 10 interrupts the clock of the inner logic to measure the DC voltage from the output pin. A precision measurement unit (PMU) 14 is utilized to specialize the internal setting and measure the DC voltage. Finally, with the result of the measurement, it is determined whether the device under testing 22 is qualified or not. Through the conventional process, it is a waste of time to transfer only one testing code each time and to interrupt the clock in the logic tester 10 while the DC voltage is measured. Whereupon, a long testing time is required and the efficiency for testing the device under testing 22 is further influenced.

BRIEF SUMMARY OF THE INVENTION

Accordingly, an object of the invention provides a circuit testing apparatus for improving testing efficiency and solving the problems of the prior art.

An embodiment of the invention provides a circuit testing apparatus for testing a device under testing, the circuit testing apparatus comprising a logic tester and a signal-measuring module. The logic tester couples to the device under testing for providing a testing signal and a trigger signal, and determines a testing result for the device under testing according to a digital measuring result. The signal-measuring module couples to the device under testing and the logic tester for measuring a DC signal generated by the device under testing according to the testing signal after receiving the trigger signal, and generating the digital measuring result.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
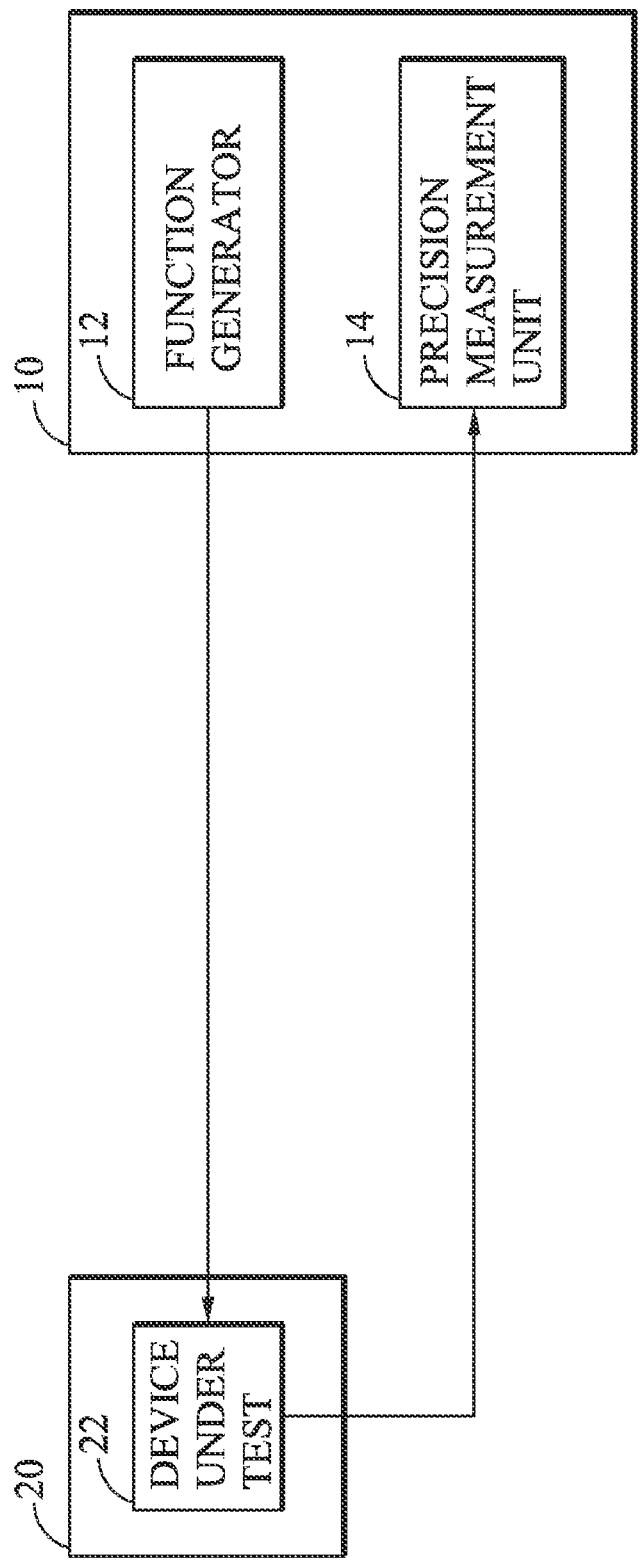
FIG. 1 is a schematic diagram of a conventional apparatus for testing the integrated circuit.
Figure 2:
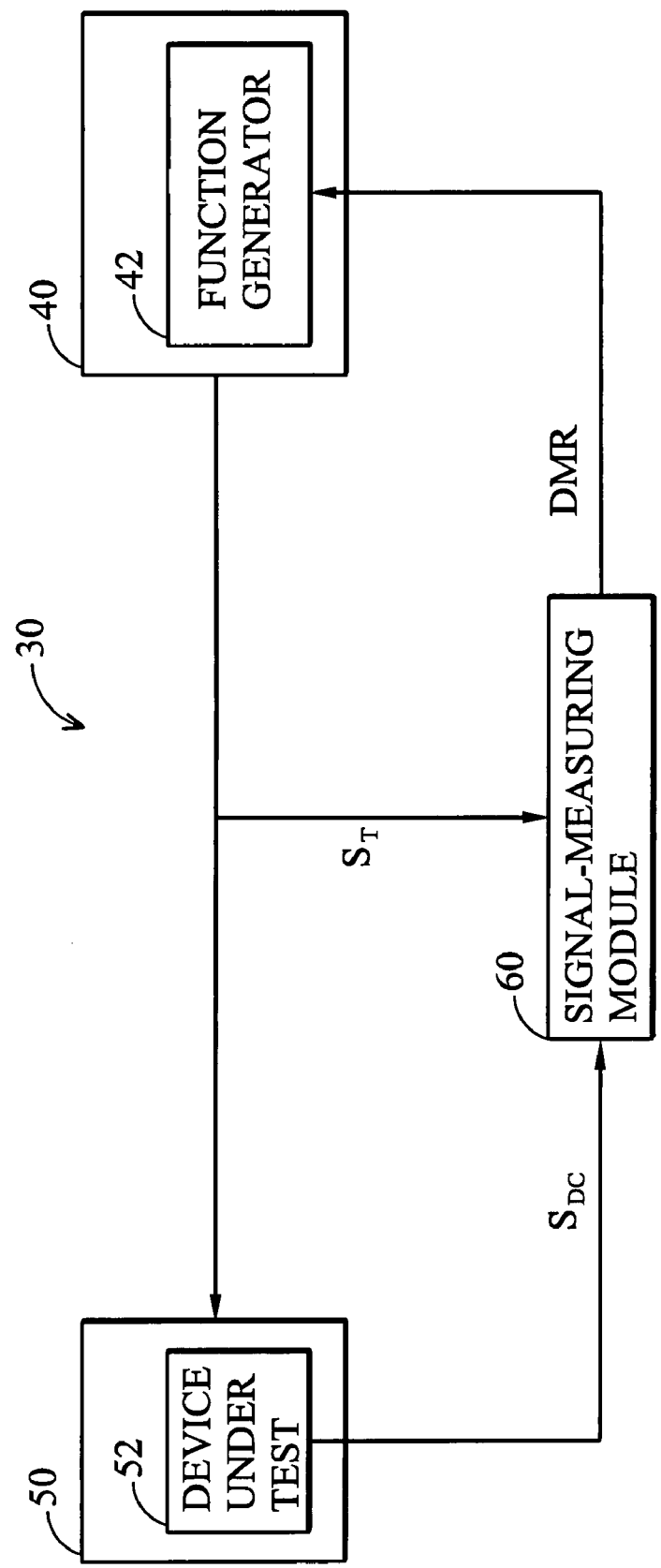
FIG. 2 is a schematic diagram of a circuit testing apparatus according to an embodiment of the present invention.

FIG. 2 is a schematic diagram of a circuit testing apparatus 30 according to an embodiment of the present invention. The circuit testing apparatus 30 is utilized to test a device under testing 52, which is usually provided on a circuit board (DUT board) 50. The circuit testing apparatus 30 comprises a logic tester 40 and a signal-measuring module 60. The logic tester 40 couples to the device under testing 52 for providing a testing signal $S_{IN}$ and a trigger signal $S_T$, and determines a testing result for the device under testing 52 according to a digital measuring result DMR. The logic tester 40 may be a testing apparatus for executing digital operations. The signal-measuring module 60 couples to the device under testing 52 and the logic tester 40 for measuring a DC signal $S_{DC}$ generated by the device under testing 52 according to the testing signal $S_{IN}$ after receiving the trigger signal $S_T$, and generating the digital measuring result DMR.

In the embodiment, the logic tester 40 comprises a function generator 42 for generating the testing signal $S_{IN}$ and the trigger signal $S_T$. While receiving the digital measuring result DMR, the function generator 42 further determines the testing result of the device under testing 52 according to the digital measuring result DMR.

Figure 3:
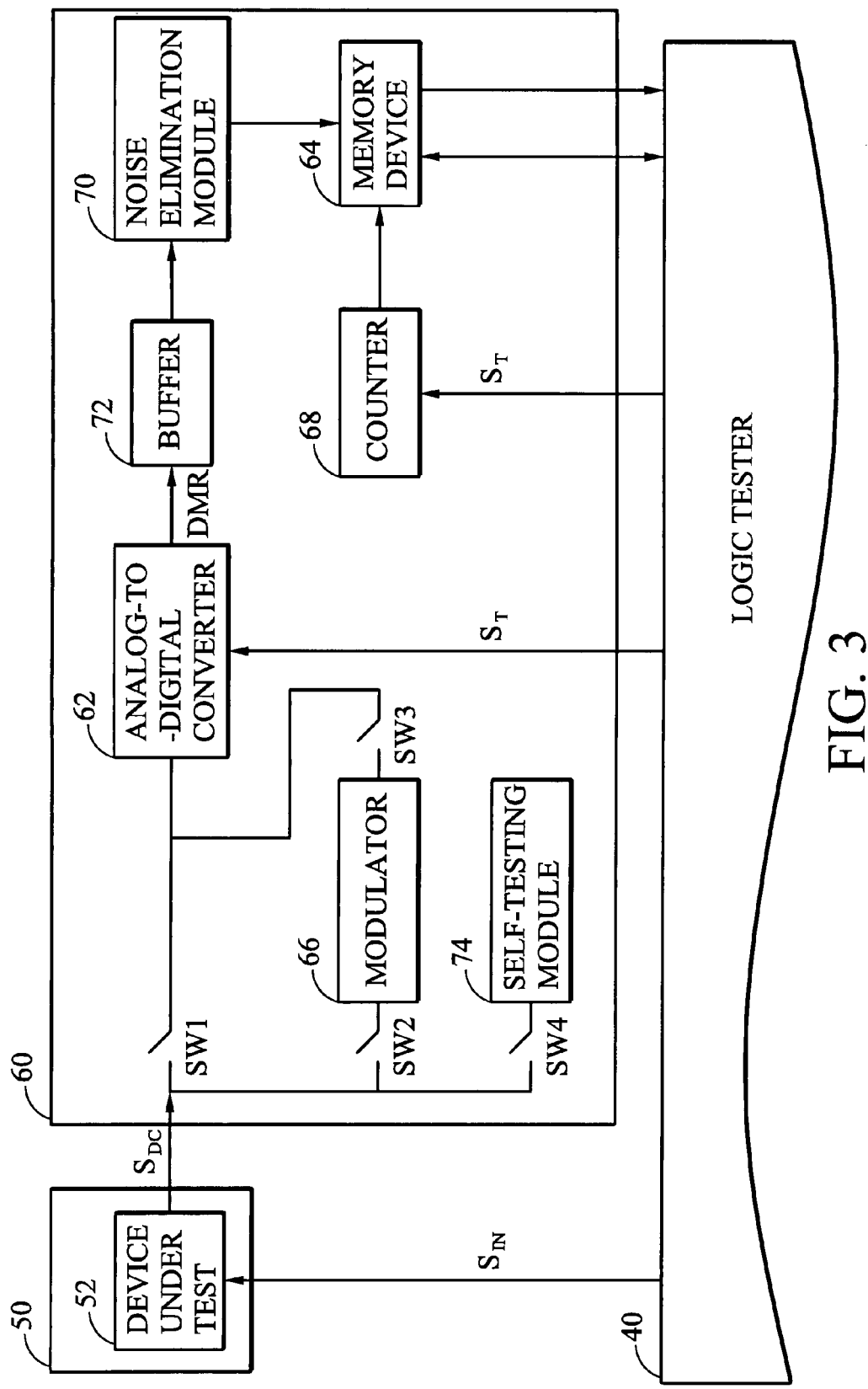
FIG. 3 illustrates a schematic diagram of an experimental signal-measuring module.

FIG. 3 illustrates a schematic diagram of an embodiment of the signal-measuring module 60. The signal-measuring module 60 comprises an analog-to-digital converter 62 and a memory device 64. The analog-to-digital converter 62 receives the trigger signal $S_T$, and generates the digital measuring result DMR according to the DC signal $S_{DC}$. For example, the digital measuring result DMR may be the digitalized voltage levels of the DC signal $S_{DC}$. The logic tester 40 thus determines the testing result of the device under testing 52 according to the digital measuring result DMR. The memory device 64 couples to the analog-to-digital converter 62 for storing the digital measuring result DMR. In one embodiment, the memory device 64 is a static random access memory (SRAM).

Moreover, the signal-measuring module 60 further comprises a modulator 66, coupled to the device under testing 52 and the analog-to-digital converter 62, for attenuating the DC signal $S_{DC}$ to a range of voltage levels recognized by the analog-to-digital converter 62. According to one embodiment of the present invention, the modulator 66 may be an attenuator. While the voltage level of the DC signal $S_{DC}$ from the device under testing 52 exceeds the maximum input value of the analog-to-digital converter 62, the signal-measuring module 60 attenuating the DC signal $S_{DC}$ by the modulator 66. The DC signal $S_{DC}$ is attenuated to a range of voltage levels recognized by the analog-to-digital converter 62, and then inputted to the analog-to-digital converter 62 for measuring. In this regard, it is desirable to extend the measuring range of the signal-measuring module 60.

According to another embodiment of the present invention, a counter 68 is further provided to the signal-measuring module 60. The counter 68, which is coupled to the logic tester 40 and the memory device 64, counts after receiving the trigger signal $S_T$, and allocates the location of the memory device 64 where the digital measuring result DMR is stored. Similarly, the logic tester 40 reads the digital measuring result DMR from the memory device 64 along the store location allocated by the counter 68.

The signal-measuring module 60 additionally comprises a noise elimination module 70, coupled to the memory device 64 and the analog-to-digital converter 62, for eliminating the noise while the digital measuring result DMR is transferred from the memory device 64 to the logic tester 40. In one embodiment, the noise elimination module 70 is a switch. The logic tester 40 turns off the switch to eliminate and prevent the noise interference as reading the digital measuring result DMR from the memory device 64. The signal-measuring module 60 also comprises a buffer 72 coupled to the analog-to-digital converter 62 and the memory device 64 for enhancing the DC signal.

In yet another embodiment, the signal-measuring module 60 further comprises a self-testing module 74. The self-testing module 74 is coupled to the analog-to-digital converter 62 and generates a self-testing signal to proceed a self-testing of the signal-measuring module 60. It is depicted below to illustrate a process flow of self-testing by the signal-measuring module 60. As the signal-measuring module 60 is self-testing, the self-testing module 74 sends a self-testing signal, which is a predetermined voltage level. By means of the operation of the signal-measuring module 60, the logic tester 40 likewise reads the testing result from the memory device 64 and the signal-measuring module 60 is then be verified and revised thereof. Therefore, the reliability of measuring the integrated circuit (IC) is correspondingly improved.

In addition, the signal-measuring module 60 comprises a plurality of control switches (SW1~SW4). Each of these control switches (SW1~SW4) is coupled to the device under testing 52, the analog-to-digital converter 62, the modulator 66, and the self-testing module 74. The plurality of control switches (SW1~SW4) is turned on or turned off respectively to determine whether the connection between the device under testing 52, the analog-to-digital converter 62, the modulator 66, and the self-testing module 74 is short or open, and the various operations of the signal-measuring module 60 is further controlled. In the signal-measuring module 60, all elements illustrated in FIG. 3 are not necessarily provided. Besides, the signal-measuring module 60 may also selectively bypass one or more elements in FIG. 3 via the control switches (SW1~SW4) as a testing requirement (for example, based on the logic tester 40).

According to the embodiments of the present invention, as a result of applying the signal-measuring module to measure the DC signal, a series of the testing signals may be transferred, and thus the plurality of the corresponding digital testing results are generated. The plurality of the digital testing results are stored in the memory device of the signal-measuring module in advance, afterward read by the logic tester, and finally determined by the function generator. Compared with the prior art, it is possible thereby to make efficiency of testing time from the embodiments of the present invention.

While the invention has been described by way of examples and in terms of preferred embodiment, it is to be understood that the invention is not limited to thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A circuit testing apparatus for testing a device under testing, comprising:
    a logic tester coupled to the device under testing for providing a testing signal and a trigger signal and determining a testing result for the device under testing according to a digital measuring result; and
    a signal-measuring module coupled to the device under testing and the logic tester for measuring a DC signal generated by the device under testing according to the testing signal after receiving the trigger signal, and generating the digital measuring result;
    wherein the testing signal is sent directly to the device under testing from the logic tester without passing through the signal-measuring module, and the trigger signal is directly sent to the signal-measuring module from the logic tester; and
    wherein the signal-measuring module comprises:
        an analog-to-digital converter for receiving the trigger signal and generating the digital measuring result according to the DC signal;
        a memory device coupled to the analog-to-digital converter for storing the digital measuring result;
        a counter, in which coupled to the logic tester and the memory device for counting after the trigger signal is received by the counter and allocating the location of the memory device where the digital measuring result is stored; and
        a modulator, in which coupled to the device under testing and the analog-to-digital converter for attenuating the DC signal to a range of voltage levels recognized by the analog-to-digital converter.

2. The circuit testing apparatus as claimed in claim 1, wherein the logic tester comprises a function generator for generating the testing signal and the trigger signal.

3. The circuit testing apparatus as claimed in claim 2, wherein the function generator determines the testing result for the device under testing according to the digital measuring result.

4. The circuit testing apparatus as claimed in claim 1, wherein the signal-measuring module further comprises a self-testing module, in which coupled to the analog-to-digital converter for generating a self-testing signal and proceeding a self-testing of the signal-measuring module.

5. The circuit testing apparatus as claimed in claim 4, wherein the signal-measuring module further comprises a plurality of control switches, in which coupled to the device under testing, the analog-to-digital converter, the modulator, and the self-testing module respectively, for determining whether the connection between the device under testing, the analog-to-digital converter, the modulator, and the self-testing module is short or open.

6. The circuit testing apparatus as claimed in claim 1, wherein the signal-measuring module further comprises a noise elimination module, in which coupled to the analog-to-digital converter and the memory device for eliminating the noise while the digital measuring result is transferred from the memory device to the logic tester.

7. The circuit testing apparatus as claimed in claim 6, wherein the noise elimination module is a switch.

8. The circuit testing apparatus as claimed in claim 1, wherein the signal-measuring module further comprises a buffer, in which coupled to the analog-to-digital converter and the memory device for enhancing the DC signal.

9. The circuit testing apparatus as claimed in claim 1, wherein the memory device is a static random access memory (SRAM).

10. The circuit testing apparatus as claimed in claim 1, wherein the signal-measuring module is utilized to measure the voltage levels of the DC signal for generating the digital measuring result.

11. A circuit testing apparatus for testing a device under testing, comprising:
- a logic tester coupled to the device under testing for providing a testing signal and a trigger signal and determining a testing result for the device under testing according to a digital measuring result;
- a signal-measuring module coupled to the device under testing and the logic tester for measuring a DC signal generated by the device under testing according to the testing signal after receiving the trigger signal, and generating the digital measuring result; and
- an analog-to-digital converter for receiving the trigger signal and generating the digital measuring result according to the DC signal;

wherein the testing signal is directly sent to the device under testing from the logic tester without passing through the signal-measuring module, and the trigger signal is directly sent to the signal-measuring module from the logic tester; and wherein the signal-measuring module comprises:
- a memory device coupled to the analog-to-digital converter for storing the digital measuring result; and
- a counter, in which coupled to the logic tester and the memory device for counting after the trigger signal is received by the counter and allocating the location of the memory device where the digital measuring result is stored.

* * * * *